JUNCTION-TYPE SEMICONDUCTOR DEVICES

Filed Oct. 20, 1953 2 Sheets-Sheet 1

INVENTOR.
HARVEY STUMP,
BY Seymour M. Rosenberg
HIS ATTORNEY.

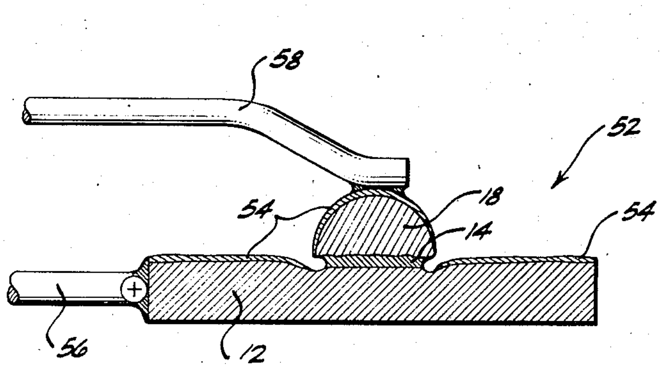
FIG. 5.
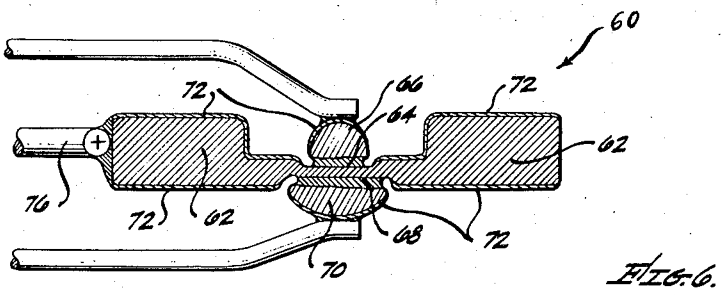
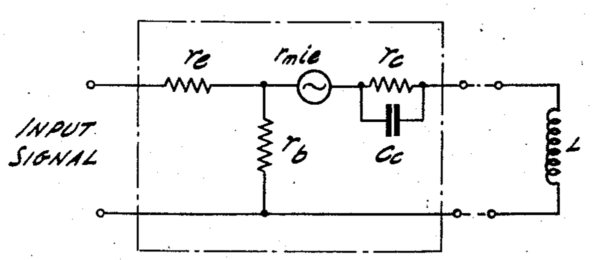
FIG. 7.
INVENTOR.
HARVEY STUMP,
BY
Seymour M. Rosenberg
HIS ATTORNEY.

United States Patent Office 2,802,159

Patented Aug. 6, 1957

2,802,159

JUNCTION-TYPE SEMICONDUCTOR DEVICES

Harvey Stump, Culver City, Calif., assignor, by mesne assignments, to Hughes Aircraft Company, a corporation of Delaware Application October 20, 1953, Serial No. 387,274

13 Claims. (Cl. 317—235)

This invention relates to junction-type semiconductor devices, and more particularly to fused junction semiconductor devices having extremely low base resistances and to methods of making these devices.

Recent advances in the semiconductor art have produced a new class of semiconductor translating devices which have been termed fused junction-type semiconductor devices and which include both crystal rectifiers or diodes and semiconductor triodes or transistors. In this new class of semiconductor devices a P–N junction or rectifying barrier is produced between two regions of a continuous solid specimen of a monatomic semiconductor by fusing an alloy of predetermined constituency into a semiconductor starting specimen of one conductivity type to convert a portion of the specimen to the opposite conductivity type.

The term "monatomic semiconductor material," as utilized herein, is considered generic to both germanium and silicon. Although the invention will be disclosed with particular reference to germanium, it is to be understood that silicon may be utilized equally well in the junction-type semiconductor devices of the present invention and in the processes employed in their manufacture.

A preferred method for producing fused junction-type semiconductor devices is the process disclosed in copending United States patent applications Serial No. 303,626, for "Junction-Type Semiconductor Devices," by S. H. Barnes et al., filed August 9, 1952, now Patent No. 2,742,-383, and Serial No. 393,038, for "Fused Junction Semiconductor Devices," by J. N. Carman, Jr., et al., filed November 19, 1953, in which a button of an alloy including a donor impurity is fused with a P-type semiconductor specimen which includes a trace of an acceptor impurity. When the heat utilized to fuse the button into the semiconductor material is removed, a portion of the semiconductor material which has been dissolved by the alloy button is regrown onto the semiconductor specimen. Owing to the presence of the donor impurity in the alloy button, however, the conductivity type of the regrown region of the semiconductor specimen is opposite to the conductivity type of the bulk of the original starting specimen, thereby creating a P–N junction within the semiconductor specimen. To produce a N–P–N junction transistor, the process is merely carried out twice on opposite surfaces of a relatively thin semiconductor specimen.

In the prior art, P–N junctions in monatomic semiconductors have also been produced by fusing a button of an alloy including an acceptor impurity, such as indium, with an N-type semiconductor specimen. According to this prior-art method, carrying out the fusion process on opposite surfaces of the semiconductor specimen produces a P–N–P junction transistor.

Although fused junction semiconductor devices have been found to be relatively easy to produce and are considered to be readily reproducible, they have also been found to have relatively high base resistances which limit the circuit applications and general utility of the devices. The term "base resistance," as herein utilized, refers to the effective resistance between a rectifying barrier and the ohmicly connected base electrode which is affixed to the semiconductor material on one side of the rectifying barrier. Thus, in a transistor the base resistance is the resistance from the base electrode to the emitter and collector junctions, whereas the base resistance in a crystal rectifier is the bulk resistance of the semiconductor material or, in other words, the resistance between the base electrode and the single rectifying junction.

Generally speaking, the base resistance of a fused junction semiconductor device is directly proportional to the resistivity of the semiconductor material and the distance from the rectifying barrier to the associated base electrode and is inversely proportional to the cross-sectional area of the base region. Due to the fact that the geometry and electrical characteristics of fused junction semiconductor devices, and of fused junction transistors in particular, require the use of a relatively thin flat base region of relative high-resistivity semiconductor material, the base resistance of fused junction semiconductor devices is large relative to the base resistance of semiconductor devices produced by other methods.

In the prior art one method employed to reduce the base resistance of fused junction semiconductor devices is to utilize an annular base electrode which is positioned around the collector or emitter junction and is ohmicly connected to the base region adjacent one of the junctions. Still another prior art technique which has been utilized to decrease the base resistance of these devices is to plate a portion of the base region wtih a metallic film to effectively short circuit a portion of the bulk semiconductor in the base region.

Although each of these techniques has succeeded to a limited extent in lowering the base resistance of fused junction semiconductor devices, they are inherently limited by several factors. Firstly, it is extremely difficult to solder or otherwise affix the base electrode to the base region adjacent the rectifying barriers without re-fusing the alloy buttons with the base region while the base electrode is being connected. Secondly, exceptional care is required to place an annular-shaped base electrode or a plated metallic film, even as close as .010 of an inch from the rectifying barrier. Accordingly, the base resistance is seldom decreased below values of the order of 25 to 50 ohms. Thirdly, the results of these prior-art techniques are erratic and are not readily reproducible. In other words, it is impossible to foretell with any accuracy what the base resistance of the completed devices will be.

The present invention obviates the above and other disadvantages of the prior art and fulfills a long standing need in the semiconductor field by providing readily reproducible fused junction semiconductor devices in which an ohmic connection is made to the base region exceptionally close to the rectifying barrier, thereby providing fused junction devices having base resistances of the order of five ohms. According to the fundamental concept of the present invention, an evaporated metallic film is deposited on the base region to within distances of the order of .001 of an inch from the rectifying barrier by employing the alloy button as a mask to prevent the metallic layer from reaching the external periphery of the rectifying barrier and thereby short circuiting the junction.

More specifically, according to the methods of this invention, a fused junction semiconductor device produced in the conventional manner is first etched, either electrolytically or chemically, to create a preferentially etched groove in the semiconductor material at the rectifying barrier and overshadowed by the adjacent alloy button. A metallic film is then evaporated on the device in a high vacuum from a point directly above the alloy button. Due to the fact that the evaporated atoms of metal travel in substantially straight lines, the overhanging outer periphery of the alloy button overshadows or masks off the rectifying barrier and permits the evaporated metallic layer to be deposited as close as .001 of an inch from the rectifying barrier without short circuiting the rectifying barrier.

The methods herein disclosed may be applied to the production of either fused junction semiconductor diodes or transistors, according to the present invention, by merely preferentially etching the device and evaporating a metallic layer on each surface of the base region where a P–N junction has been formed by fusion with an alloy button. In either type of device the low base resistances provided by the present invention permit higher forward currents, reliable operation with larger input signals, and operation at higher ambient temperatures. In addition, the fused junction diodes of this invention may be readily employed as logarithmic function generators, due to the fact that the current varies substantially logarithmically in accordance with the resistance of the base region when a variable voltage signal is applied.

The fused junction transistors of this invention, on the other hand, have increased voltage and power gain when operated with either their emitter electrode or base electrode grounded, and may be utilized at relatively high frequencies because the low base resistance permits the capacitance of the collector junction to be tuned out readily with an external inductor.

It is therefore an object of this invention to provide fusion-type semiconductor devices in which the resistance of the base region is of the order of five ohms by depositing a metallic layer on the base region immediately adjacent the rectifying barrier.

Another object of this invention is to provide fused junction semiconductor devices in which the resistance of the base region is lowered by etching the devices and evaporating a metallic layer thereon.

It is also an object of this invention to provide fused junction semiconductor devices in which the base region has deposited thereon a metallic layer which extends to within distances of the order of .001 of an inch from the recitfying junction.

Still another object of this invention is to provide fused junction semiconductor devices in which an evaporated metallic layer short circuits substantially all of the base region and is prevented from short circuiting the rectifying barrier by a preferentially etched groove at the rectifying barrier which masks the barrier when the metallic layer is evaporated onto the devices.

An additional object of this invention is to provide fused junction semiconductor devices in which a preferentially etched groove at the rectifying barrier between the alloy button and the base region is overshadowed by the alloy button, and in which a metallic layer is deposited over the base region with the exception of that portion of the base region overshadowed by the button.

A further object of this invention is to provide a fused junction transistor in which a metallic layer is deposited on the base region to within distances of the order of .001 of an inch from the emitter and collector junctions.

It is also an object of this invention to provide methods for producing fused junction semiconductor devices having low base resistances by etching a fused junction device to undercut the semiconductor material at the barrier region, thereby masking the external periphery of the rectifying barrier with the alloy button, and by depositing a metallic layer on those portions of the device which are visible from a point directly above the alloy button.

Still an additional object of this invention is to provide methods for producing low-base-resistance fused junction semiconductor devices by preferentially etching a groove at the rectifying barrier to mask the rectifying barrier with other portions of the device and by depositing a metallic layer on only those portions of the device which are unmasked.

It is still another object of this invention to provide methods for producing a low-base-resistance fused junction semiconductor device by preferentially etching the device at the rectifying barrier to overshadow the rectifying barrier with the adjacent alloy button utilized to create the rectifying barrier in the device, and by depositing a metallic layer on the base region with the exception of that portion of the base region overshadowed by the alloy button.

The novel features which are believed to be characteristic of the invention, both as to its organization and method of operation, together with further objects and advantages thereof, will be better understood from the following description considered in connection with the accompanying drawings in which several embodiments of the invention are illustrated by way of examples. It is to be expressly understood, however, that the drawings are for the purpose of illustration and description only, and are not intended as a definition of the limits of the invention.

Fig. 5 is a sectional view of a fused junction semiconductor diode which has been produced according to the methods of this invention;

Fig. 6 is a sectional view of one form of fused junction transistor, according to the invention; and Fig. 7 is the equivalent circuit of a transistor illustrating one manner in which the fused junction transistors of this invention may be employed in high-frequency applications.

Figure 1:
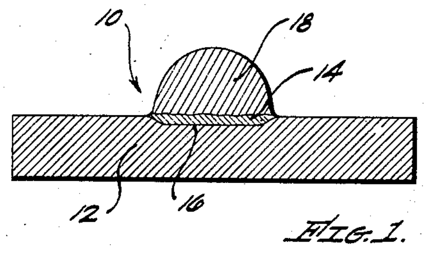
Fig. 1 is a sectional view of a conventional fused junction semiconductor diode on which the methods of this invention are to be carried out.

Referring now to the drawings, wherein like or corresponding parts are similarly designated throughout the several views, there is shown in Fig. 1 a conventional fusion-type P–N junction semiconductor diode, generally designated 10, which will be utilized to illustrate the method of producing a low-base-resistance junction-type semiconductor device according to the present invention. Diode 10 preferably includes a crystallographically oriented base region 12, which for the purpose of illustration will be assumed to be a single crystal of P-type germanium, and a relatively small region 14 of single-crystal N-type germanium which is separated from the base region by a rectifying barrier 16. Diode 10 also includes an alloy button 18 which is in ohmic contact with N-type region 14 and which may be utilized to ohmicly connect the N-type region with an associated electrode, not shown.

The fused junction diode shown in Fig. 1 may be produced by placing an alloy button, including of the order of 95 percent lead and 5 percent arsenic, on the 1–1–1 surface plane of a P-type germanium starting specimen which has been crystallographically oriented. Heat is then applied to fuse the alloy button with the adjacent region of the germanium, thereby dissolving a portion of the germanium specimen and creating a lead-arsenic-germanium alloy. When the heat is removed, a portion of the dissolved germanium regrows onto the adjacent germanium single crystal to create an N-type region which is separated from the remainder of the starting specimen by a rectifying barrier or P–N junction.

In carrying out the method of the invention to produce a fused junction semiconductor device having a low base resistance, diode 10 is now placed in an etching solution and is etched either electrolytically or by chemical action. It has been found that the inherent physical and metallurgical characteristics of junction-type semiconductor devices promote a preferential etching phenomenon when the device is etched either chemically or electrolytically. More specifically, it has been found that when a fused junction-type semiconductor device, such as diode 10, is subjected to an etching treatment, the region of the semiconductor material immediately adjacent the rectifying barrier is attacked more vigorously by the etchant than the remainder of the material, thereby creating a physical indentation or groove in the semiconductor material at the rectifying barrier.

Figure 2:
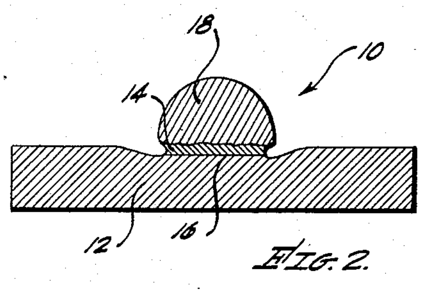
Fig. 2 is a sectional view of the fused junction diode of Fig. 1 after the diode has been etched preferentially by a chemical etchant, in accordance with one method of this invention.

Referring now to Fig. 2, there is shown the effect of a chemical etching treatment on diode 10. It will be noted that the upper surface of base region 12 has been eroded only a relatively small amount, whereas a relatively large amount of semiconductor material has been etched away adjacent rectifying barrier 16. The preferential etching phenomenon which occurs when a chemical etchant is employed is considered to be caused by two factors, namely, the fact that stresses are present in the semiconductor material adjacent the rectifying barrier and the fact that the constituency or impurity concentration of the germanium differs on either side of the rectifying barrier. Each of these factors increases the tendency for the semiconductor material to erode in a more pronounced manner at the rectifying barrier.

Although several conventional chemical etchants known to the semiconductor art have been found satisfactory for preferentially etching junction-type semiconductor devices according to the methods of this invention, it is preferable to perform the etching step by immersing the device for a period of 15 to 20 seconds in a solution containing 3 parts 48 percent hydrafluoric acid, 5 parts concentrated nitric acid, 5 parts of glacial acetic acid, and 10 drops of liquid bromine for each 50 cc. of solution.

Figure 3:
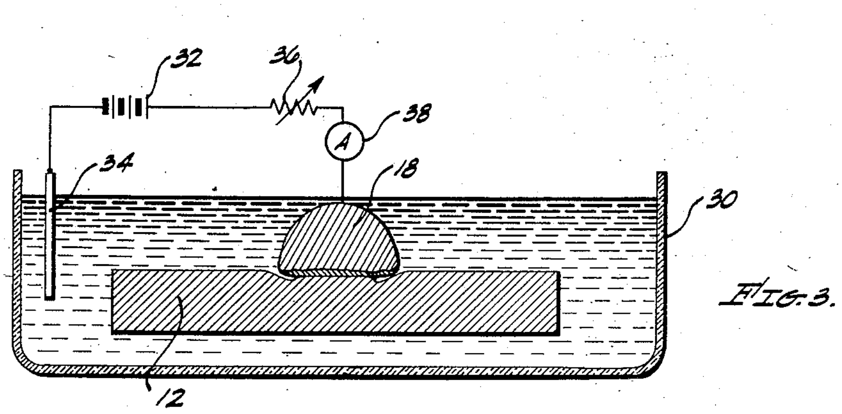
Fig. 3 is a schematic view, partly in section, of the fused junction diode of Fig. 1 illustrating one form of apparatus for preferentially etching the diode electrolytically, in accordance with another method of this invention.

Referring now to Fig. 3, there is shown one form of apparatus for preferentially etching fused junction diode 10 electrolytically, according to another method of this invention. The apparatus includes an etching beaker 30 containing an electrolytic etching solution which preferably consists of either 5 percent by weight sodium hydroxide, or 3 percent by weight phosphoric acid, and the remainder water. The apparatus also includes a source 32 of direct-current electrical energy, the cathode of which is connected to an electrode 34 immersed in the etching solution, while the anode is coupled through a variable resistor 36 and a milliammeter 38 to the alloy button of the diode.

It has been found that an etching current of the order of 25 ma. to 100 ma. applied for a period within the range from 1 to 4 minutes will preferentially etch the semiconductor material of the fused junction devices substantially in the manner shown in Fig. 3. It will be noted that very little germanium has been removed from base region 12 in comparison with the chemical etching treatment set forth above, whereas a relatively deep and narrow groove or indentation has been etched in the semiconductor material at the rectifying barrier. The apparent reason why the electrolytic technique preferentially etches the semiconductor material in a manner more pronounced than that provided by chemical etching is the fact that a relatively strong electric field is produced across the rectifying barrier when current is supplied from energy source 32, thereby further increasing the tendency of the semiconductor material to erode in the region immediately adjacent the rectifying barrier.

An essential feature of the present invention is the fact that the alloy button be relatively impervious to the etching treatment regardless of whether the etching step is performed by electrolytic or chemical action. In addition, the preferential etching should take place in a manner such that the external terminus of the rectifying barrier is located in the region of the deepest penetration by the etchant. Accordingly, the outer periphery or external terminus of the base region is overshadowed or masked by the adjacent alloy button after the etching step has been completed.

The next step in the production of low-base-resistance fused junction semiconductor devices, according to the methods of this invention, is to deposit a layer or film of a conducting metallic material, such as gold, on the semiconductor device to provide a relatively low resistance path between the rectifying barrier and the outer extremity of the base region where the associated base electrode is to be connected to the device. In performing this step, it is desirable to deposit the metallic layer as close as possible to the rectifying barrier without short circuiting the rectifying barrier.

Figure 4:
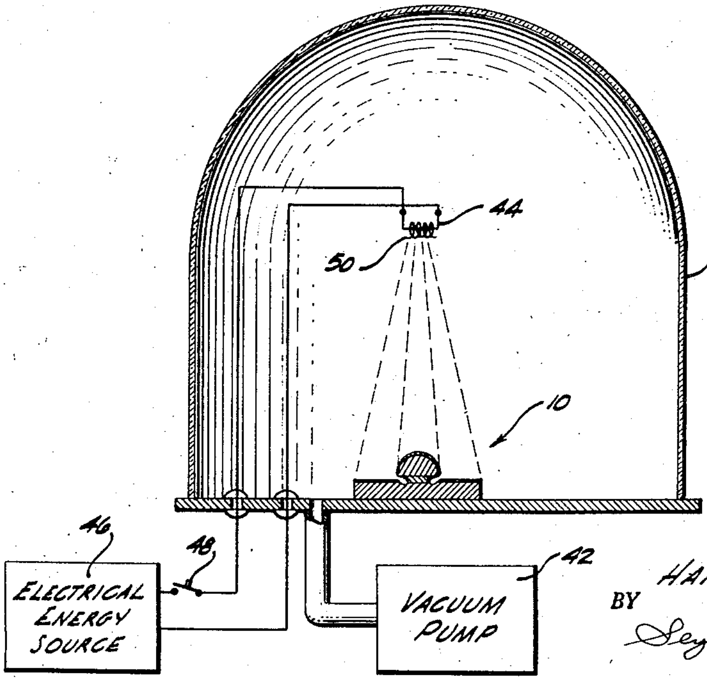
Fig. 4 is a schematic view, partly in section, of one form of apparatus for evaporating a metallic film on the preferentially etched diode of Fig. 2 or Fig. 3.

Referring now to Fig. 4, there is shown one form of apparatus for carrying out the step of coating the base region of a preferentially etched fused junction device with an electrically conductive metallic layer. The apparatus includes an evaporation chamber 40 which may be evacuated by vacuum pump 42, and a heater element, such as tungsten wire 44, which is energizable from a source 46 of electric energy upon closure of a switch 48 to evaporate atoms from a metallic specimen 50 which is wound about wire 44. Although metallic specimen 50 is preferably gold, other materials such as ruthenium or copper have been found to be satisfactory for carrying out the methods of this invention.

In operation, the preferentially etched semiconductor diode 10 is placed inside evaporation chamber 40 so that alloy button 18 is directly beneath tungsten wire 44 and its associated gold specimen 50. After diode 10 has been properly positioned relative to the heating element, evaporation chamber 40 is evacuated by vacuum pump 42. When a relatively high vacuum has been created within the evacuation chamber, switch 48 is closed to heat the tungsten wire and thereby evaporate gold atoms from specimen 50 onto the semiconductor diode.

It will be recognized by those skilled in the art that if the vacuum within the evaporation chamber is made sufficiently high to provide a mean free path equal to or greater than the distance between specimen 50 and diode 10, evaporated gold atoms will travel in straight lines away from the gold specimen and strike the surface of diode 10. It has been found preferable to carry out the evaporation step of the method of this invention with the semiconductor device positioned between 5 and 10 centimeters away from the gold specimen in order to prevent heat radiated from the tungsten wire from refusing alloy button 18 with the semiconductor material. Accordingly, the vacuum within the evaporation chamber should be of the order of one-half a micron of mercury to insure that the mean free path of the evaporated gold atoms is sufficiently long to prevent diffusion of the evaporated atoms into the preferentially etched groove of the semiconductor device.

It is clear, therefore, that the gold atoms which strike fused junction diode 10 are deposited only on those portions of the device which are visible from the source of evaporated atoms or, in other words, those portions which are visible from the gold specimen. Thus, the evaporated atoms of gold will be deposited upon the upper surface of both base region 12 and alloy button 18 extremely close to the rectifying barrier, but will not be deposited on the external periphery of the rectifying barrier which is located in the preferentially etched groove overshadowed by the alloy button. In practice, the evaporated layer may be deposited within the order of .001 of an inch from the rectifying barrier, and base resistances of the order of 5 ohm centimeters have been consistently reproduced by carrying out the methods of this invention.

Referring now to Fig. 5, there is shown a fused junction semiconductor diode 52, according to the invention, which includes a gold layer or film 54 which has been deposited on the surface of base region 12 by carrying out the evaporation step set forth above. Diode 52 also includes a base electrode 56 which is ohmicly connected to one side of the base region, and an emitter electrode 58 which is ohmicly connected to alloy button 18. Metallic layer 54 is preferably of sufficient thickness to provide a resistivity of the order of one ohm per square. The resistivity of the evaporated layer may be varied as desired, of course, by varying the thickness of the metallic layer deposited upon the device. Because of the fact that the chemical etching treatment provides a broader groove than that provided by the electrolytic etching treatment, it will be recognized that thicker metallic layers may be deposited upon a device which has been chemically etched, thereby providing metallic layers with even lower resistivities.

Several of the relatively obvious advantages inherent in the fused junction semiconductor diode of this invention are the decrease in $I^2R$ loss in the device owing to the reduction in the effective base resistance of the device, and the heat sink provided by the evaporated metallic layer for conducting away heat generated at the rectifying barrier. It is clear, of course, that both of these advantages contribute to permit the application of larger input signals to the device for any given power rating. In addition, the low base resistance greatly increases the forward conductance of the diode at a given voltage for a rectifying barrier of a given area.

Still another advantage of the fused junction diode of the present invention is the fact that the device may be utilized more effectively as a logarithmic junction generator. It is known that the current through a fused junction diode may be expressed by the relationship:

$$I=\frac{V}{r_e+r_b}$$

where:

$I$=current through the device
$V$=impressed potential
$r_e$=the resistance of the rectifying barrier, and
$r_b$=the base resistance of the diode.

It is also known that the resistance of the barrier ($r_e$) is a logarithmic function of the current through the diode while the base resistance is substantially constant for a given operating temperature. Clearly, therefore, if the base resistance of the device is decreased to the order of 5 ohms, the response of the diode to an applied electrical signal will vary logarithmically until the resistance of the barrier region approaches the same order of magnitude as the base resistance.

It should be understood that the methods disclosed hereinabove for producing low-base-resistance fused junction diodes are equally applicable to the production of low-base-resistance fused junction transistors according to the invention. Referring now to Fig. 6, there is shown a fused junction transistor, generally designated 60, which includes a base region 62, an emitter junction 64 formed by fusing an alloy button 66 with one surface of the base region, and a collector junction 68 formed by fusing an alloy button 70 with the opposite surface of the base region. It will be noted that base region 62 has a cavity in the surface in which the emitter junction is formed. This cavity is preferably produced by sandblasting the germanium starting specimen in order to provide a relatively thin base region between the emitter and collector junctions when the alloy buttons are fused with the germanium starting specimen.

Transistor 60 also includes two preferentially etched grooves at both the emitter and collector junctions, respectively, these grooves being provided by carrying out the preferential etching treatment set forth hereinabove in order to mask the external periphery of the emitter and collector junctions with their associated alloy buttons. A metallic layer 72, which has been evaporated upon the surface of base region 62 in accordance with the method described with regard to Fig. 4, consequently establishes good ohmic contact with the base region immediately adjacent the emitter and collector junctions without short circuiting the junctions. Clearly, therefore, a low resistance path is provided from the junctions to a base electrode 76 ohmicly connected to an edge of the base region.

It should be expressly understood that although metallic layer 72 is shown to be deposited on both surfaces of transistor 60, low-base-resistance transistors according to the invention may also be produced by merely evaporating a metallic layer on one surface of the base region. Thus, for the particular transistor configuration shown in Fig. 6, a low-base-resistance device may be produced by evaporating the metallic layer only on the collector side of base region 62.

When the fused junction transistor of this invention is utilized in an electrical circuit, the proximity of metallic layer 72 to the emitter and collector junctions again decreases the power loss in the bulk semiconductor and provides a heat sink for carrying away heat generated at both the emitter and collector junctions. The transistor is thereby enabled to amplify or modulate relatively large input signals for a given power rating. In addition, the metallic layer may be employed to provide an excellent ohmic contact between the base electrode and the base region by carrying out the evaporation step of the invention after the base electrode has been affixed to the base region.

Consider now the frequency response and high-frequency utility of the fused junction transistor of the present invention. As illustrated by the transistor equivalent circuit shown in Fig. 7, the frequency response of a transistor is limited primarily by the collector capacitance ($C_c$) which is relatively large for junction-type transistors. However, the relatively low base resistance ($r_b$) of transistors produced according to the methods of this invention permits the collector capacitance to be tuned out with an external inductor (L), thereby providing satisfactory transistor operation at frequencies as high as 5 to 10 megacycles.

It may also be shown by analysis that for a given collector junction area, the voltage and power gains for a junction transistor are inversely proportional to the base resistance when the transistor is operated in either a grounded emitter circuit or a grounded base circuit. Owing to the exceptionally low base resistance of the fused junction transistor of this invention, therefore, both higher voltage gains and higher power gains may be readily realized.

What is claimed as new is:

1. In a semiconductor translating device, the combination comprising: a specimen of semiconductor material; an alloy button fused with said specimen on one surface thereof; a rectifying barrier in said semiconductor specimen immediately adjacent said alloy button, said specimen being necked down at said rectifying barrier whereby the periphery of said rectifying barrier is overshadowed by said alloy button; and a metallic layer in ohmic contact with the portion of said one surface of said specimen which is not overshadowed by said alloy button.

2. In a semiconductor translating device, the combination comprising: a specimen of monatomic semiconductor material, an alloy button fused with said specimen on one surface thereof; a rectifying barrier in said semi-conductor material adjacent the junction of said alloy button with said specimen, the circumference of said rectifying barrier being smaller than the circumference of said alloy button, whereby the periphery of said rectifying barrier and the immediately adjacent portion of said one surface is masked by said alloy button; and a metallic layer on the portion of said one surface which is not masked by said alloy button.

3. The combination defined in claim 2, wherein said monatomic semiconductor material is germanium and said metallic layer is gold.

4. The combination defined in claim 3, wherein said monatomic semiconductor material is germanium and said alloy button includes an alloy of lead and arsenic.

5. In a semiconductor translating device, the combination comprising: a germanium specimen; an alloy button fused to a portion of one surface of said specimen, said germanium specimen including a P–N junction rectifying barrier immediately adjacent said portion of said one surface, the area of said rectifying barrier being smaller than the cross-sectional area of said alloy button whereby said alloy button masks the periphery of said rectifying barrier; and a gold film covering the region of said one surface of said specimen which is unmasked by said alloy button.

6. The combination defined in claim 5, wherein said germanium specimen is a crystallographically oriented single crystal and said one surface of said specimen is the 1–1–1 surface plane of said crystal.

7. In a semiconductor translating device, the combination comprising: a semiconductor specimen having a predetermined crystallographic surface plane; an alloy button fused to said specimen on said surface plane to form a P–N junction rectifying barrier in said specimen in the region adjacent said alloy button; a preferentially etched groove in said specimen at said rectifying barrier, whereby said rectifying barrier is overshadowed by said alloy button; and a gold layer in ohmic contact with the portion of said surface plane which is not overshadowed by said alloy button.

8. A low-base-resistance fused junction transistor comprising: a semiconductor specimen having first and second opposing surfaces; an emitter rectifying barrier in said specimen adjacent said first surface; a first alloy button fused with said specimen on said first surface, the periphery of said first alloy button overshadowing the external periphery of said emitter rectifying barrier; a collector rectifying barrier in said specimen adjacent said second surface and directly opposite said emitter rectifying barrier; a second alloy button fused with said specimen on said second surface, the periphery of said second alloy button overshadowing the external periphery of said collector rectifying barrier; and a conducting metallic layer on the unmasked portion of at least one of said first and second surfaces.

9. A low-base-resistance fused junction transistor comprising: a germanium single-crystal specimen having first and second opposing surfaces, said first and second surfaces constituting a predetermined crystallographic surface plane of said specimen; an emitter rectifying barrier in said specimen adjacent said first surface; a first lead-arsenic alloy button fused with said specimen on said first surface, the periphery of said first alloy button overshadowing the external periphery of said emitter rectifying barrier; a collector rectifying barrier in said specimen adjacent said second surface and directly opposite said emitter rectifying barrier; a second lead-arsenic alloy button fused with said specimen on said second surface, the periphery of said second alloy button overshadowing the external periphery of said collector rectifying barrier; and a gold layer on the unmasked portion of at least one of said first and second surfaces.

10. In the method of producing a low-base-resistance fused junction semiconductor device, the combination of steps comprising: fusing an alloy button with a germanium specimen on one surface thereof to create a P–N junction rectifying barrier in the specimen immediately adjacent the alloy button; etching the specimen and the alloy button to provide a preferentially etched groove in said specimen at the rectifying barrier to overshadow the rectifying barrier with the alloy button; and evaporating a conducting metallic layer from a point substantially directly above the alloy button.

11. In the method of producing a low-base-resistance fused junction semiconductor device, the steps comprising: fusing an alloy button with a semiconductor specimen on one surface thereof to provide a rectifying barrier in the specimen adjacent the alloy button; etching the semiconductor specimen and the alloy button to preferentially erode the specimen at the rectifying barrier for masking the periphery of the rectifying barrier with the alloy button; placing the preferentially etched specimen in an evaporation chamber; evacuating the evaporation chamber to a predetermined pressure; and evaporating a conducting metallic material on the semiconductor specimen from a point directly above the alloy button, the amount of pressure determined by said evacuation step being sufficient to permit the evaporated metallic material to travel in straight lines to deposit on the specimen.

12. In the method of producing a low-base-resistance fused junction semiconductor device, the steps comprising fusing an alloy button with a semiconductor specimen on one surface thereof to provide a rectifying barrier in the specimen adjacent the alloy button; etching the semiconductor specimen and the alloy button to preferentially erode the specimen at the rectifying barrier, whereby the periphery of the rectifying barrier is masked with the alloy button; and evaporating a conducting metallic layer on the unmasked portion of the semiconductor specimen to provide a low-resistance path on said specimen between the extremities thereof to a region immediately adjacent the rectifying barrier.

13. The method of producing a low-base-resistance fused junction transistor, said method comprising the steps of fusing a first alloy pellet with a germanium specimen on one surface thereof to provide an emitter rectifying junction in the semiconductor specimen on the one surface, fusing a second alloy pellet with the specimen on the opposite surface thereof to provide a collector rectifying barrier in the specimen on the opposite surface, etching the germanium specimen to preferentially erode the specimen at the emitter and collector rectifying barriers to mask the periphery of the rectifying barriers with the alloy pellets, and evaporating a conducting metallic layer on the unmasked portion of at least one of the surfaces of the specimen.

References Cited in the file of this patent

UNITED STATES PATENTS

| | | |
|---|---|---|
| 2,644,852 | Dunlap | July 7, 1953 |
| 2,666,814 | Shockley | Jan. 19, 1954 |
| 2,754,455 | Pankove | July 10, 1956 |